United States Patent
Street et al.

(10) Patent No.: US 7,125,495 B2
(45) Date of Patent: Oct. 24, 2006

(54) LARGE AREA ELECTRONIC DEVICE WITH HIGH AND LOW RESOLUTION PATTERNED FILM FEATURES

(75) Inventors: Robert A. Street, Palo Alto, CA (US); William S. Wong, San Carlos, CA (US); Alberto Salleo, San Francisco, CA (US); Michael L. Chabinyc, Burlingame, CA (US)

(73) Assignee: Palo Alto Research Center, Inc., Palo Alto, CA (US)

( * ) Notice: Subject to any disclaimer, the term of this patent is extended or adjusted under 35 U.S.C. 154(b) by 94 days.

(21) Appl. No.: 11/019,037

(22) Filed: Dec. 20, 2004

(65) Prior Publication Data
US 2006/0131266 A1    Jun. 22, 2006

(51) Int. Cl.
*G01D 15/00* (2006.01)
(52) U.S. Cl. ............... 216/27; 438/745; 430/311
(58) Field of Classification Search ............ 438/21, 438/22, 745, 750; 430/311, 313; 216/27
See application file for complete search history.

(56) References Cited

U.S. PATENT DOCUMENTS

| | | | |
|---|---|---|---|
| 5,900,160 A | 5/1999 | Whitesides et al. | |
| 6,334,960 B1 | 1/2002 | Willson et al. | |
| 6,413,790 B1 * | 7/2002 | Duthaler et al. | 438/21 |
| 6,655,286 B1 | 12/2003 | Rogers | |
| 2004/0219246 A1 | 11/2004 | Jeans | |

OTHER PUBLICATIONS

Michael D. Austin and Stephen Y. Chou "Fabrication of 70nm channel length polymer organic thin-film transistors using nanoimprint lithography", Applied Physics Letters, vol. 81, No. 23, Dec. 2, 2002.

* cited by examiner

*Primary Examiner*—Lan Vinh
(74) *Attorney, Agent, or Firm*—Bever, Hoffman & Harms, LLP; Patrick T. Bever

(57) ABSTRACT

Two different processing techniques are utilized to respectively form high resolution features and low resolution features in a critical layer of an electronic device, and in particular a large area electronic device. High resolution features are formed by soft lithography, and low resolution features are formed by jet-printing or using a jet-printed etch mask. Jet-printing is also used to stitch misaligned structures. Alignment marks are generated with the features to coordinate the various processing steps and to automatically control the stitching process. Thin-film transistors are formed by generating gate structures using a first jet-printed etch mask, forming source/drain electrodes using soft lithography, forming interconnect structures using a second jet-printed etch mask, and then depositing semiconductor material over the source/drain electrodes. Redundant structures are formed to further improve tolerance to misalignment, with non-optimally positioned structures removed (etched) during formation of the low resolution interconnect structures.

3 Claims, 10 Drawing Sheets

FIG. 3
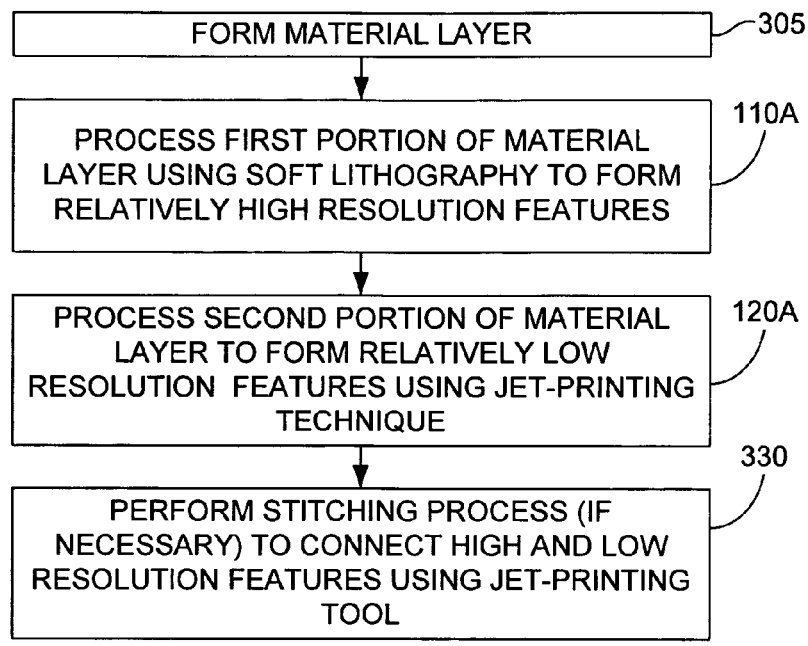
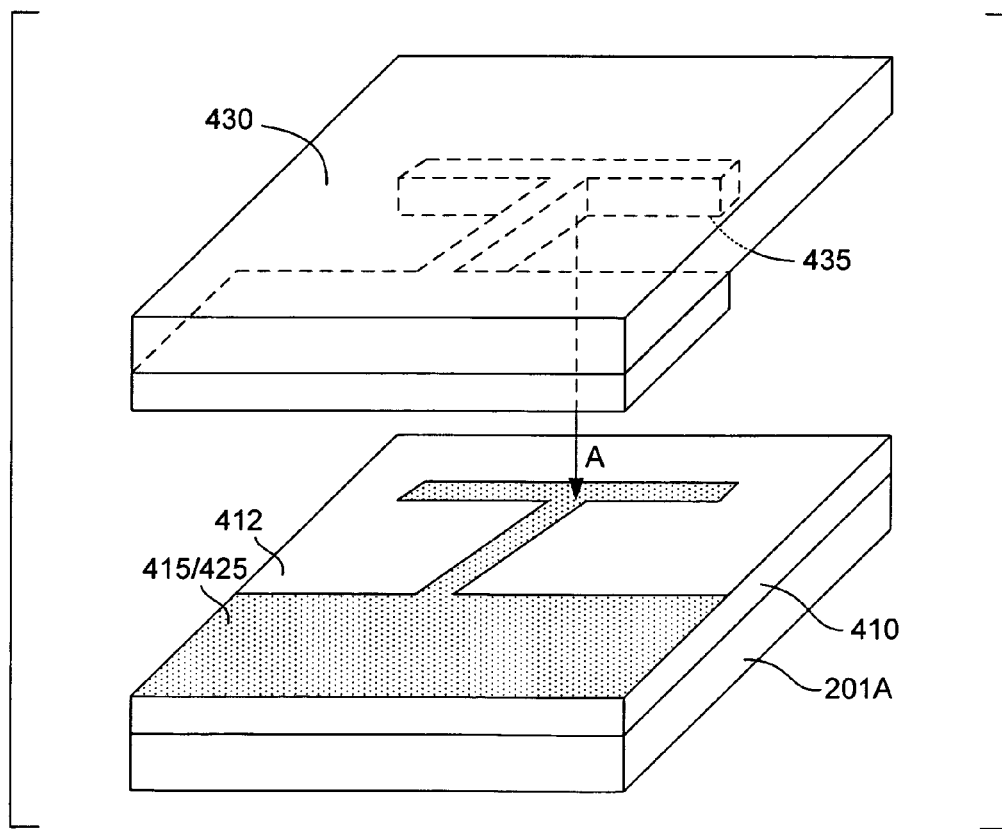
FIG. 4(A)

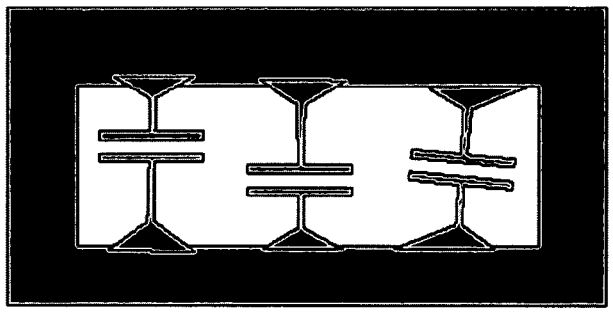
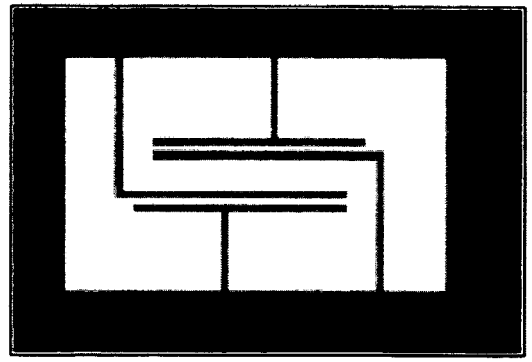
FIG. 10(A)　　　　FIG. 10(B)
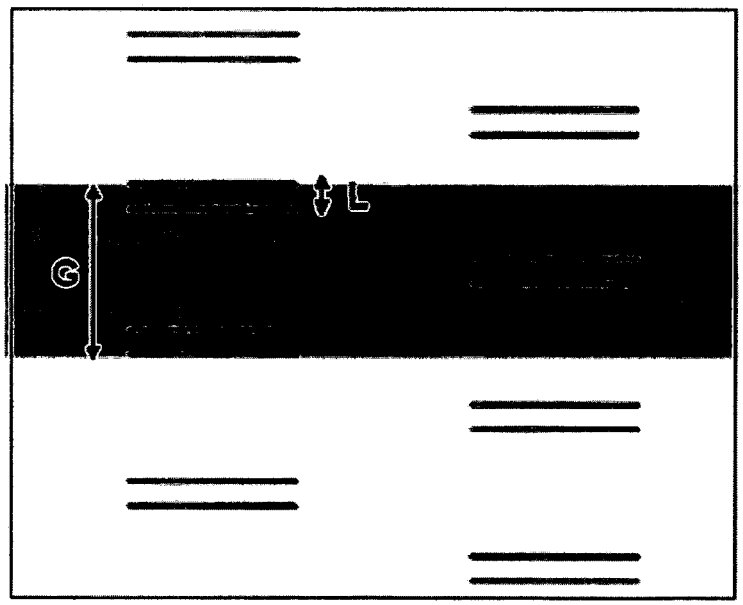
FIG. 11

LARGE AREA ELECTRONIC DEVICE WITH HIGH AND LOW RESOLUTION PATTERNED FILM FEATURES

FIELD OF THE INVENTION

This invention relates to integrated circuit (IC) fabrication, and more particularly to methods for generating patterned film layers for ICs that can be used in the production of large area electronic devices.

BACKGROUND OF THE INVENTION

Large area electronic devices, such as flat panel displays, sensor arrays, and space antennas, typically include large area sensor or light-emitting electronic cells that are addressed and/or controlled by thin film transistors (TFTs) and other electrical and electronic devices (e.g., passives and photodiodes). Such large area electronic devices are expensive to make by conventional photolithography techniques due to the relatively large size of the electronic cell arrays (e.g., 1000 cm$^2$ or larger), and the relatively large spacing between adjacent TFTs. Conventional photolithography equipment for fabricating typical (i.e., ~300 cm$^2$ or smaller) IC devices is typically constructed to receive and process a semiconductor wafer having a predetermined size, and such wafers are typically much smaller than the substrate of a large area electronic device. Therefore, specialized equipment for photolithography on large area substrates must be developed typically at great expense. Moreover, conventional photolithography equipment includes optical and other processing tools that are constructed to facilitate the formation of substantially smaller feature sizes than those required in many elements of large area electronic devices, thereby making the production of large area electronic devices using such photolithography equipment highly inefficient.

Jet-printing is an emerging technology that attempts to reduce the costs associated with IC production by replacing expensive photolithographic processing with simple printing operations in which layer structures are formed using materials ejected from a print head. By printing an IC pattern directly on a device substrate rather than using the delicate and time-consuming lithography processes used in conventional IC manufacturing, an IC printing system can significantly reduce IC production costs. The printed IC pattern can either comprise actual IC features (i.e., elements that will be incorporated into the final IC, such as the gates and source and drain regions of TFTs, signal lines, the semiconductor, opto-electronic components, etc.), or it can be a mask printed onto the substrate that is used for subsequent semiconductor processing steps (e.g., etch, implant, etc.). Such masks are referred to herein as "jet-printed etch masks".

Typically, jet-printing involves depositing a print solution (generally a material in a solvent or a liquid) by raster bitmap along a single axis (the "print travel axis") across a solid substrate. Print heads, and in particular, the arrangements of the ejectors incorporated in those print heads, are optimized for printing along this print travel axis. The solid substrate is mounted under the print heads, and either the substrate is moved relative to the fixed print head, or the print head is moved over the fixed substrate. In either case, printing of an IC pattern takes place in a raster fashion, with the print head making "printing passes" across the substrate as the ejector(s) in the print head dispense individual droplets of print solution onto the substrate. At the end of each printing pass, the print head makes a perpendicular shift relative to the print travel axis before beginning a new printing pass. The print head continues making printing passes across the substrate in this manner until the IC pattern has been fully printed. Once dispensed from the ejector(s) of the print head, print solution droplets attach themselves to the substrate through a wetting action and proceed to either dry by evaporation of a carrier solvent or solidify in place if a pure material is deposited.

Because jet-printing of etch masks where the pattern is stored on a computer, which is also referred to as "digital lithography", is not limited to a particular wafer size, it provides a promising technique for fabricating large area arrays of thin film transistors which are utilized, for example to drive large area displays or sensor arrays. However, at present, jet-printing is limited to producing relatively low resolution features (e.g., 30–50 microns), and therefore cannot meet all of the requirements for large area arrays. That is, much of the large area electronic device can be printed at low resolution (e.g., features) because wide metal lines are needed for interconnects. However, as discussed below, the transistors perform much better if they have very small features (e.g., approximately one micron), and are thus better suited to a high resolution printing process.

A problem with the large feature sizes produced by jet-printing techniques is that it places limitations on the speed and parasitic capacitance of TFTs forming the large area electronic device, and in many cases the high capacitance is the more serious problem. A generic design of the metal contacts to a TFT 1300 is shown in FIG. 13. TFT 1300 includes a gate region 1310, a source region 1320 and a drain region 1330, all formed from a conductive material, with source region 1320 and drain 1330 being separated from gate region 1310 by a dielectric layer (not shown). The conductance of TFT 1300 is proportional to W/L ratio formed by the source and drain structures of TFT 1300, where W is the width and L is the length of these structures. The area of TFT 1300 is W×L (width times length), the transit time is proportional to $L^2$/mobility, and the parasitic capacitance is proportional to W×D, where D is the overlap distance of the gate and source regions and may be smaller than the feature size, but is of the same order of magnitude.

The operating speed of TFT 1300 is generally limited by RC time-constants, and ultimately by the RC time-constant of the TFT itself. A low resistance (high current) TFT requires a large W/L, but when fabricated with large feature sizes (e.g., a large D), this produces a high parasitic capacitance, which increases power consumption and reduces operating speed. In a simple approximation, the capacitance is proportional to the square of the feature size. As such, producing a large area electronic device using a relatively low resolution processing tool, such as jet-printing, results in relatively slow and inefficient TFTs. In particular, the jet-printing approach typically gives large feature sizes, and presently the size is 20–40 micron for conventional printheads. The feature size can probably be reduced significantly, but it is doubtful whether it is possible to reach 1–2 micron, thus limiting the ability of jet-printing to produce low capacitance, high speed TFTs. However, jet-printing provides very good registration between different layers, because the accuracy of drop placement is limited only by the random variation in the drop ejection direction, and this can be reduced below 5 microns.

Soft lithography (a.k.a., stamping or microcontact printing) and imprint lithography are relatively high resolution printing techniques that facilitate the production of circuit structures having smaller features sizes (e.g., dimensions well below one micron have been demonstrated), and thus the production of much higher performance TFTs than those produced using jet-printing techniques. Soft lithography involves forming a printing press-like structure from a soft material (e.g., polydimethylsiloxane), which is referred to as a stamp, that prints a resist pattern directly onto a material (e.g., metal) layer deposited over a device substrate. The stamp is positioned (registered) over the desired substrate region using an appropriate X-Y positioning table, and then pressed against the device substrate with a predetermined force, thereby transferring a patterned resist layer onto the substrate. In another variation, a resist layer can be coated onto the substrate and embossed using the stamp in a process referred to as imprint lithography.

A problem with soft lithography is that the registration accuracy of different layers is relatively lower than that provided by jet-printing, and so the benefit of the small feature sizes is not realized in the production of large area electronic devices. Further, the production of large stamps (i.e., suitable for printing an entire critical layer of a large area electronic device) is difficult because of the potential for mechanical distortions in the features of the stamp.

What is needed is a method for producing ICs, and in particular, large area electronic devices, that includes both the cost efficiency of low resolution processing, but also provides the performance advantages associated with high resolution features.

SUMMARY OF THE INVENTION

The present invention is directed to a method for producing patterned film layers for electronic devices in which two different processing techniques (tools) are utilized to respectively form high resolution features (structures) and low resolution features in a critical layer (e.g., source/drain metal layer) of the electronic device. In particular, only those features of the critical layer that require high resolution (e.g., on the order of one to five microns), such as the spacing of the source/drain electrodes of thin film transistor (TFT) structures, are produced using suitable high resolution processing techniques, such as soft lithography or imprint lithography. In contrast, features of the critical layer that can be produced using low resolution (e.g., on the order of ten to fifty microns), such as interconnect line structures, are produced using suitable low resolution fabrication processing techniques, such as jet-printing, gravure printing, flexography or screen printing. The low resolution features are formed such that they connect to the high resolution features, thereby providing an electronic device that combines the superior performance of structures produced by high resolution processing techniques with interconnect structures produced using economical low resolution processing techniques.

In accordance with a specific embodiment of the present invention, high resolution features are generated using a soft lithography (stamping) processing technique, and low resolution features are generated using jet-printing, which may also be utilized to "stitch", if necessary, the high and low resolution features that may be separated by misalignment between the stamping and jet-printing tools. High resolution features (e.g., source/drain structures) are formed on a device substrate by forming a metal layer, patterning the metal layer by forming an etch resist pattern on the metal layer using a soft lithography stamp, and removing (etching) exposed portions of the metal layer to define the high resolution features. Low resolution features are then formed in a way that preserves the high resolution features, and such that the high resolution features are operably interconnected by way of the low resolution features. In one specific embodiment, a print solution containing a conductive material (e.g., metallic nanoparticles) is jet-printed directly onto the device substrate to form the low resolution features. In another specific embodiment, a jet-printed etch mask is used to form the low resolution features, for example, by patterning portions of the metal layer that are retained during formation of the high resolution features. Disconnections between the low resolution features and high resolution features may then be "repaired" (stitched) by jet-printing corrective bridge structures across gaps separating the unintentionally disconnected features. Jet-printing is thus particularly suited for producing the low resolution features because, in addition to forming the low resolution features in a highly efficient manner, the jet-printing equipment is capable of performing the stitching process to significantly increase production yields.

In accordance with another embodiment of the present invention, alignment marks are produced during the formation of the high resolution features, and these alignment marks are utilized during one or more of the low resolution feature formation and the subsequent stitching process. In one embodiment, the alignment marks generated during the soft lithography process are utilized by a process control system to control the subsequent jet printing process such that the low resolution features are adapted to misalignments of the stamped high resolution features. The location of the stamped alignment marks and the position of the print head during jet-printing may be used to determine the need for and location of a subsequent stitching operation. In another embodiment, the low resolution features are formed by jet-printed masks that include an additional set of alignment marks. The stamped and jet-printed alignment marks may then be utilized to automatically measure misalignment between the soft lithography and jet-printing processes, and to control (if necessary) a stitching process to bridge gaps between the high and low resolution features (i.e., to complete the intended connection between these features).

In accordance with another embodiment of the present invention, the present invention is utilized to produce high performance TFT arrays for large area electronic devices. Gate structures are formed by depositing and patterning a gate metal layer using a jet-printed etch mask. A dielectric layer is then formed, and a source/drain metal layer is deposited over the dielectric layer. Source/drain electrodes are then formed on the dielectric layer by stamping and etching the source/drain metal layer. Interconnect structures are then formed using a second jet-printed etch mask, which protects the source/drain electrodes during further etching of the source/drain metal layer to form the interconnect structures. Finally, a semiconductor region is formed over the source/drain electrodes, and stitching is performed (if needed) to close any open circuits. Thus, high performance TFTs for large area electronic devices are produced at a minimal cost due to the use of jet-printing to generate both the gate and interconnect structures, and also to perform the stitching process (when needed). Further, by carefully designing the stamp used to form the source/drain electrodes and the jet-printed etch mask used to form the interconnect structures, the process can be made highly tolerant to misalignment of the stamp and masks, thereby increasing production yields.

In accordance with another embodiment of the present invention, to further improve the tolerance to mis-registration of the stamp to the first metal layer, spaced-apart, substantially identical redundant features are formed during the high resolution processing phase, and one or more of these redundant features is removed during the low resolution processing phase (i.e., a retained one of the redundant features forms the desired high resolution feature). In particular, one or more optimally placed redundant features is identified prior to the low resolution processing phase, and these optimally placed redundant features are protected from removal during the low resolution etching process (i.e., non-optimal redundant features are exposed by resist pattern during the etching process, and are therefore removed). For example, the mask could contain several copies of a TFT source/drain structure at different positions. After the stamping process is completed, the alignment mark(s) formed with the redundant source/drain structures and the alignment mark(s) formed with the gate structure are inspected, and the optimum device location can be selected automatically. The second masking step is then controlled (automatically) to protect the selected source/drain structures during the low resolution etching process (i.e., the non-selected source/drain structures are exposed by the jet-printed etch mask, and therefore removed during the etch). Etch patterns are optimized for the known type and magnitude of the misalignment of a particular printing process.

BRIEF DESCRIPTION OF THE DRAWINGS

These and other features, aspects and advantages of the present invention will become better understood with regard to the following description, appended claims, and accompanying drawings, where:

FIG. 3 is a flow diagram showing a simplified method for producing integrated circuits according to another embodiment of the present invention;

FIGS. 4(A), 4(B), 4(C) and 4(D) are simplified perspective views showing structures produced in accordance with the method of FIG. 3;

FIGS. 10(A) and 10(B) are plan views showing stamp patterns including redundant high resolution structures according to another embodiment of the present invention;

FIG. 11 is a plan view depicting redundant high resolution structures formed over a gate structure according to another embodiment of the present invention;

DETAILED DESCRIPTION OF THE DRAWINGS

The present invention is described below with reference to certain exemplary embodiments, and primarily with reference to embodiments involving the production of thin film transistors (TFTs) for large area electronic devices. Although described with particular reference to TFTs for large area electronic devices, the present invention may also be utilized to produce other electrical and electronic circuit components utilized on large area electronic devices. In addition, the method described herein is not necessarily limited to the production of large area electronic devices, and may be utilized as a cost effective production method for certain small area electronic devices. Therefore, unless otherwise specified, the appended claims are not limited to the specific embodiments described below.

Figure 1:
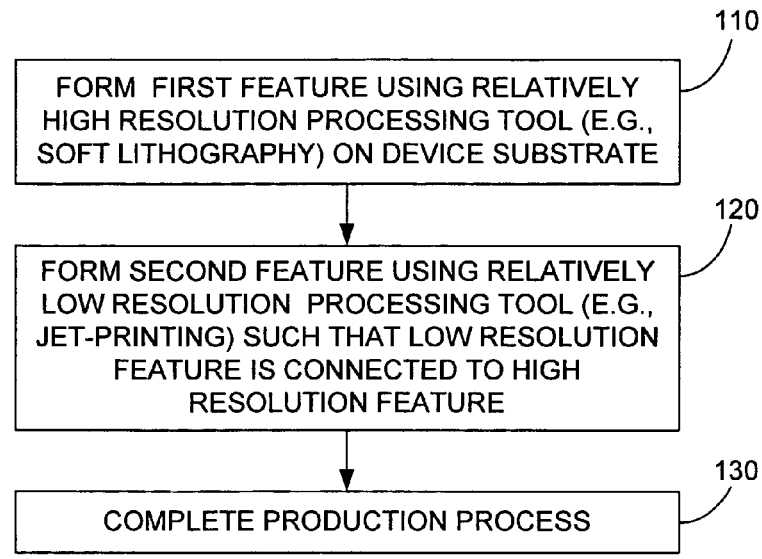
FIG. 1 is a flow diagram showing a generalized method for producing integrated circuits according to an embodiment of the present invention.
Figure 2A:
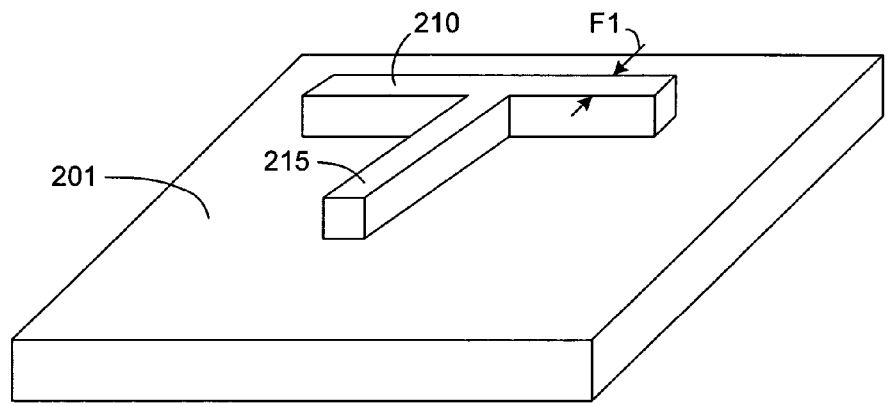
FIGS. 2(A) and 2(B) are simplified perspective views showing structures produced in accordance with the method of FIG. 1.
Figure 2B:
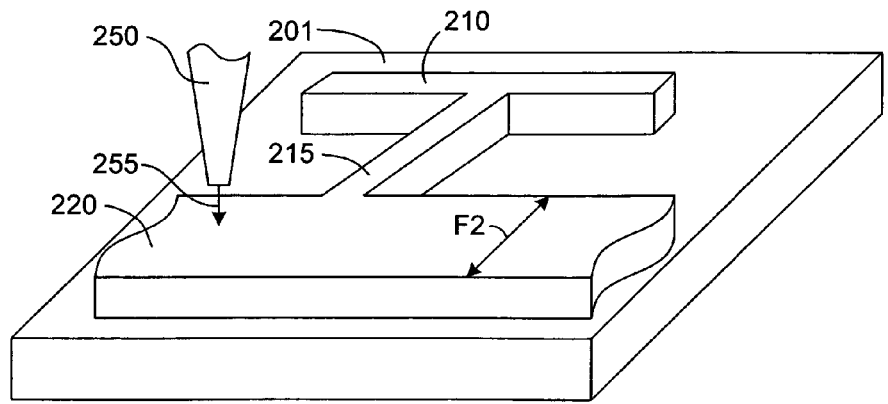

FIG. 1 is a flow diagram showing a generalized embodiment of the present invention, and FIGS. 2(A) and 2(B) are perspective views showing features (structures) formed in accordance with the method disclosed in FIG. 1. The present invention generally involves forming both low and high resolution structures on a device substrate in a two-phase process in which high resolution structures are formed during the first phase and low resolution structures are formed during the second phase.

In a first phase of the production process, high resolution features (e.g., structures having features sizes on the order of one to five microns) are formed on a device substrate using a high resolution processing tool (e.g., soft lithography or imprint lithography; block 110). FIG. 2(A) depicts an exemplary high resolution structure 210 formed on a substrate 201. High resolution structure 210 is, for example, a metal TFT source/drain structure having a feature size (width) F1 of, for example, one micron. Note that high resolution structure 210 includes a contact section 215 that is provided for connection with low resolution structures (e.g., interconnect lines).

In a second phase of the production process, low resolution features (e.g., structures having features sizes on the order of ten to fifty microns) are formed on the device substrate using a low resolution processing tool (e.g., jet-printing or screen printing) such that the low resolution features contact corresponding high resolution features (block 120). FIG. 2(B) depicts an exemplary low resolution structure 220 formed on substrate 201 utilizing a print head 250, which ejects a print solution 255 that forms low resolution structure 220 such that it connects to contact section 215 of high resolution structure 210. Low resolution structure 220 is, for example, a metal interconnect line having a feature size (width) F2 on the order, for example, of twenty to forty microns.

Returning to FIG. 1, the production process is then resumed (if necessary) to complete the desired electronic device incorporating the combined structure formed by the high resolution feature and the low resolution feature (block 130). Subsequent processing may include, for example, forming a protective layer over the combined structure. Note that, because low resolution structure 220 is connected to high resolution structure 210 (as shown in FIG. 2(B)), the present invention facilitates the production of an electronic device that combines the superior performance of structures produced by high resolution processing techniques with interconnect structures produced using economical low resolution processing techniques.

FIG. 3 is a flow diagram showing an integrated circuit production method according to a specific embodiment of the present invention. FIGS. 4(A) to 4(D) depict the method of FIG. 3 using simplified structures.

Referring to the upper portion of FIG. 3 and to FIG. 4(A), the process begins by forming a material (e.g., metal) layer 410 on a substrate 201A (block 305), and then processing metal layer 410 using a soft lithography stamp 430 to form a high resolution structure (block 110A). As shown in FIG. 4(A), processing metal layer 410 includes forming (e.g., sputtering, evaporating, plating or otherwise depositing) metal layer 410, and then utilizing stamp 430 to deposit a predetermined etch resist pattern 425 onto a retained portion 415 of metal layer 410. In particular, stamp 430 includes a raised structure 435 having a resist material coated thereon that is transferred to resist layer 420 when stamp 430 is pressed against substrate 201A (i.e., moved in the direction indicated by arrow "A"). Exposed portions 412 (i.e., those portions of metal layer 410 that are not covered by etch resist pattern 425) represent portions of metal layer 410 that are to be removed by a subsequent etching process, and etch resist pattern 425 protects retained portion 415 during the subsequent etching process. When the imprint lithography process is used, the substrate is coated with a soft resist material and the stamp 430 is pressed into the surface to form an imprinted pattern corresponding to the raised structure 435 of the stamp. The imprinted pattern exposes the metal layer which can be etched to form the desired pattern. Before etching the resist pattern is usually cleaned (e.g. by plasma).

Figure 4B:
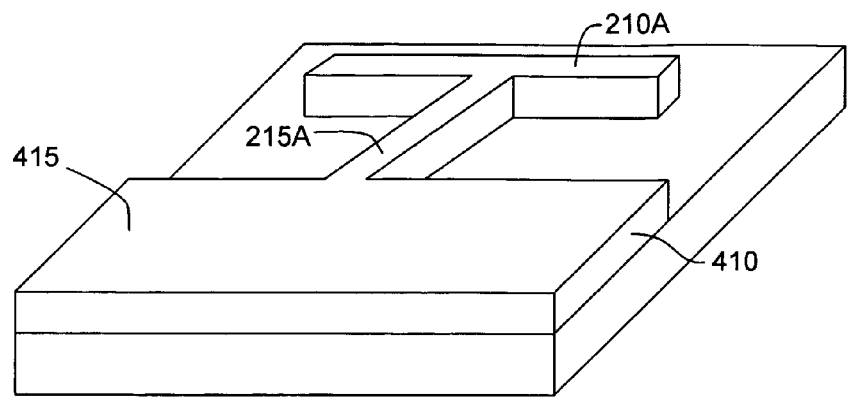

FIG. 4(B) shows metal layer 410 after etching is performed using known techniques to remove exposed portions 412 of metal layer 410, thus defining (forming) high resolution feature 210A. Note that, in the present embodiment, high resolution feature 210A is connected by contact section 215A to retained portion 415 of metal layer 410. As described below, in the present embodiment retained portion 415 is further processed using subtractive (e.g., lithographic) methods to form the desired low resolution features. In an alternative embodiment, the stamping process described above may be used to only form high resolution feature 210A and contact section 215A (i.e., retained portion 415 is removed during the etching process that defines these structures), and low resolution features may be formed using the additive jet-printing operation described above with reference to FIG. 2(B).

Figure 4C:
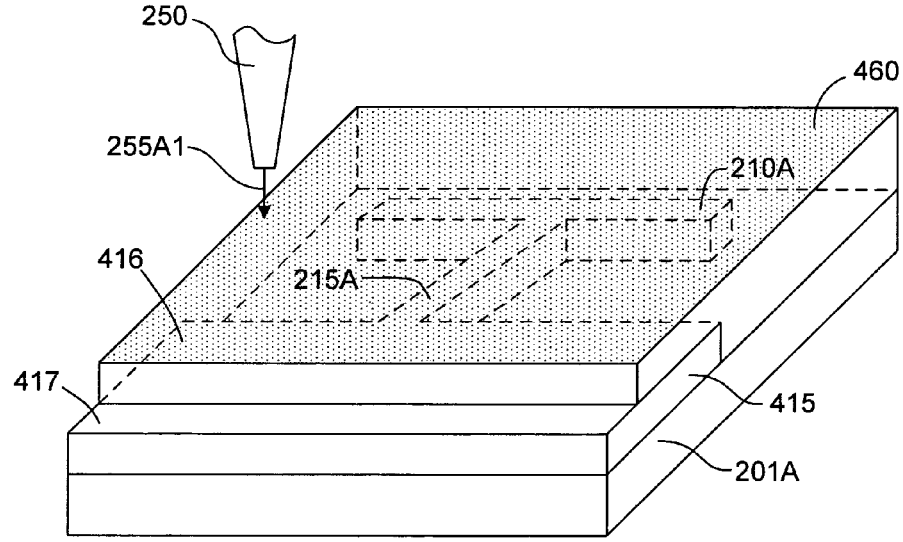
Figure 4D:
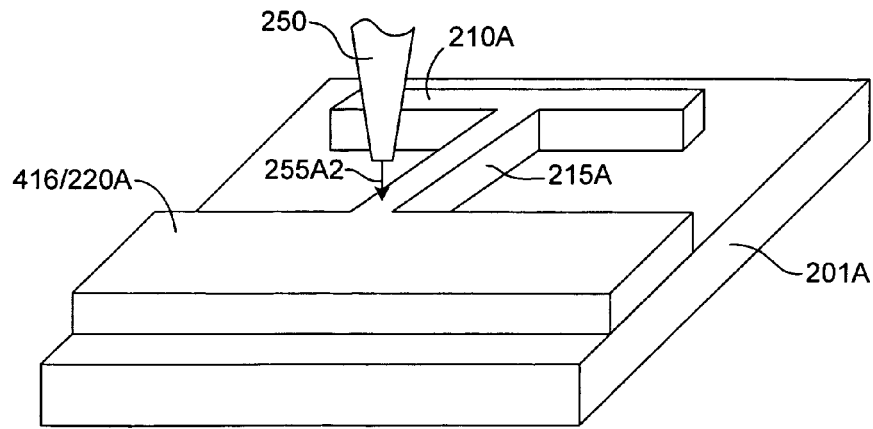

Referring to FIGS. 3 and 4(C), a subtractive jet-printing technique is utilized to process retained region 415 to form the desired low resolution features (block 120A). In the present embodiment the jet-printing technique involves utilizing print head 250 (discussed above) to form a resist layer 460 by ejecting a printing solution (resist) 255A1 over a selected section 416 of retained region 415 of substrate 201A such that a front portion 417 is exposed (i.e., not covered by resist layer 460). Exposed front portion 417 is then etched using known techniques, thus forming low resolution structure 220A from selected section 416, as shown in FIG. 4(D). Note that a portion of resist layer 460 is also formed over high resolution feature 210A and contact section 215A, thereby preventing removal of these structures during the second etching process.

Referring again to FIG. 3, after forming the high and low resolution features, according to another aspect of the present invention a stitching (repair) process is performed (if necessary) to connect high resolution feature 210A and low resolution feature 220A that may have been separated during formation due, for example, to misalignment of the stamp and/or jet-printed mask (block 330). Such gaps between high and low resolution structures, when they occur in critical areas of the IC structure, can result in operating errors and/or non-functional devices. The stitching process performed in accordance with block 330 facilitates higher production yields by providing a mechanism for repairing processing defects. The stitching process may be performed, for example, using print head 250 to eject a print solution 255A2 containing a conductive material (e.g., conductive nano-particles) suspended in a transport solvent into the gap separating the high and low resolution structures, thus forming a conductive bridge structure. Note that positioning and calibration of print head 250 relative to substrate 201A is performed using the methods disclosed in co-owned and co-pending U.S. patent application Ser. No. 10/224,701, entitled "Method for the Printing of Homogeneous Electronic Material with a Multi-Ejector Print Head" [Atty Dkt No. XCP-030], which is incorporated herein by reference in its entirety. Jet-printing is thus particularly useful for large area electronic device production in that it can be utilized to both form the low resolution features, and to repair undesirable gaps between the high and low resolution features.

In many situations, the stamp pattern utilized to form high resolution features will be much smaller than the device substrate, and multiple stamping operations will be performed to pattern the entire surface of the substrate. These multiple stamping operations may involve the use of a single stamp (e.g., to reproduce critical structures, such as the source and drain structures of a TFT), or may involve the use of several stamps configured to pattern different high resolution features. In contrast to the relatively small stamp, jet-printed masks are developed in the printing software. The only physical constraints on the size of the mask is the size of the printer system and this can, in principle, be made arbitrarily large enabling one to pattern an entire device substrate. In either case, it is important to have a reliable mechanism for coordinating the positioning of the high and low resolution features to avoid open circuit situations.

Figure 5A:
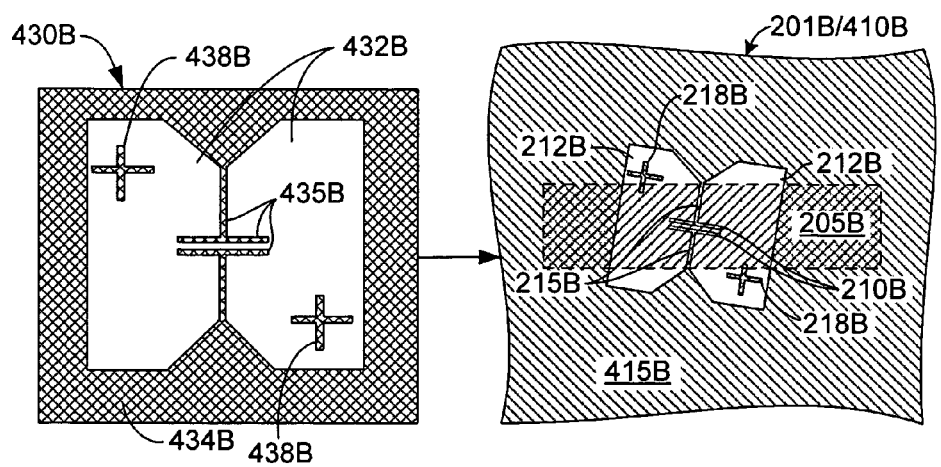
FIGS. 5(A), 5(B) and 5(C) are plan views illustrating a method for producing integrated circuits using alignment marks according to another embodiment of the present invention.
Figure 5B:
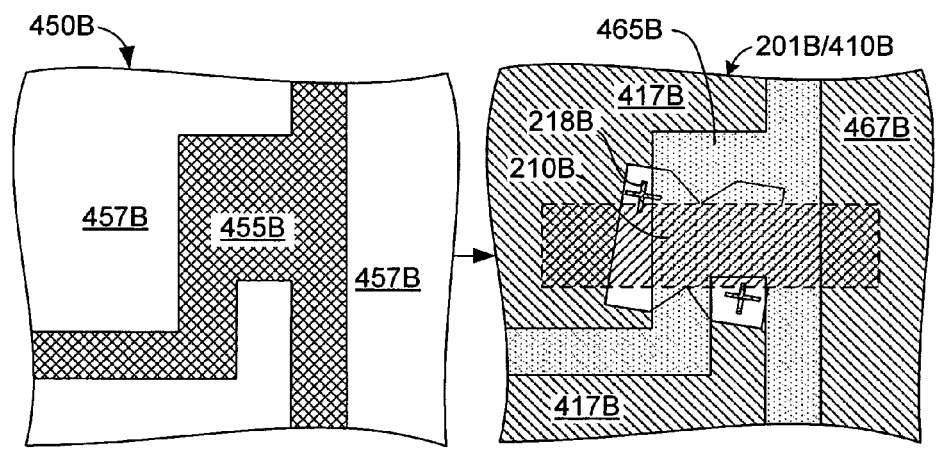
Figure 5C:
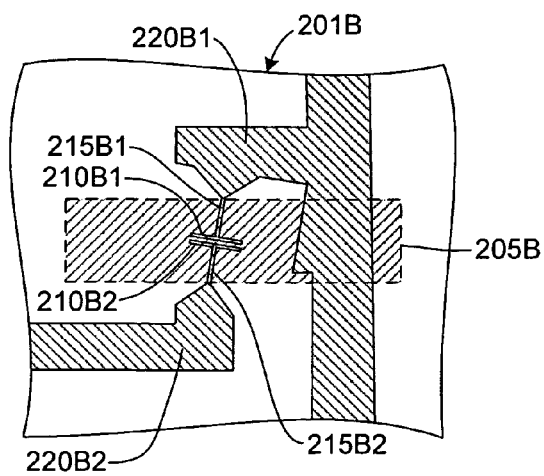

FIGS. 5(A), 5(B), and 5(C) depict a simplified example illustrating the use of alignment marks to coordinate the high and low resolution processing techniques, thereby facilitating the reliable production of large scale electronic devices.

FIG. 5(A) shows the bottom surface of a stamp 430B (left), and the top surface of a portion of a device substrate 201B (right) on which stamp 430B is applied during a soft lithography process. Referring to the left side of FIG. 5(A), stamp 430B, which is formed in manner similar to that described above, includes high resolution raised structures 435B located inside of cavity regions 432B that are surrounded by a peripheral raised region 434B. Note that high resolution raised structures 435B are in the form of source and drain electrodes of a TFT, and these electrode structures are connected to peripheral raised region 434B. Also included in cavity regions 432B are one or more raised alignment mark structures 438B that are utilized in the manner described below to generate alignment marks on substrate 201B. Referring to the right side of FIG. 5(A), substrate 201B includes a gate structure 205B (indicated in dashed lines) that is located under a dielectric or insulating layer (not shown), and a metal layer 410B is formed over the dielectric layer. Note that metal layer 410B has already been stamped by stamp 430B and etched in the manner described above to generate high resolution source/drain structures 210B, contact sections 215B, alignment marks 218B, and open regions 212B (i.e., holes in metal layer 410B). In one embodiment, source/drain structures 210B are two microns wide and the open (white) area is (e.g.) 50×50 microns. Note that, for purposes of describing advantages associated with the present invention that will be discussed in detail below, stamp 430B is assumed to have been slightly misaligned (i.e., tilted) relative to an optimal position.

FIG. 5(B) shows a portion of a jet-printed etch mask 450B (left) and device substrate 201B (right) after mask 450B has been used to pattern a resist layer to form a resist pattern (structure) 465B over metal layer 410B. Referring to the left side of FIG. 5(B), a printed mask 450B, which is formed in manner similar to that described above, includes a printed resist region 455B and uncovered regions 457B. As discussed above, the pattern is aligned and jetted onto the features onto the substrate to form resist features 465B.

In accordance with another aspect of the present invention, the control system utilized to position mask 450B determines an optimal position for resist pattern 465B based on the location of alignment marks 218B such that resist pattern 465B covers both source/drain structures 210B and portions of metal layer 410B needed to provide low resolution interconnect structures. As in the embodiments described above, remaining exposed portions 417B of metal layer 410B are removed (etched).

FIG. 5(C) shows the resulting structure after the mask pattern is etched into the substrate. Note that the source/gate structure formed by source electrode 210B1 and drain electrode 210B2 are located over gate structure 205B, but separated by a dielectric layer (not shown). A semiconducting material is then deposited to connect the source and drain contacts thereby facilitating the passage of current from source electrode 210B1 to drain electrode 210B2 in response to a voltage applied to gate structure 205B. Note also that source electrode 210B1 is connected to (column) interconnect structure 220B1 by way of contact section 215B1, and that drain electrode 210B2 is connected to (row) interconnect structure 220B2 by way of contact section 215B2, thereby facilitating the passage of current, for example, from column interconnect structure 220B1 to row interconnect structure 220B1. Thus, the high resolution pattern of stamp 430B (FIG. 5(A) has been connected to low resolution interconnect lines formed by jet-printed etch mask 450B (FIG. 5(B)), which is positioned using the measured location of alignment marks 438B. Even though gate metal structure 205B is large, the parasitic capacitance has been reduced due to the small dimensions of the source/drain electrodes. For example, if high resolution stamp 430B has a 2 micron linewidth and gap, a TFT with a W/L ratio of ten has a contact area over gate structure 205B of approximately 80 $\mu m^2$. By comparison, if the source and drain electrodes are formed using a low resolution processing tool (e.g., jet-printing), then the channel would be approximately 40 microns long and have an overlap (D) equal to approximately ten microns, thus producing a corresponding area of approximately 8000 $\mu m^2$, so the improvement provided by the present invention is a factor 100. Even for 20 micron jet-printed features with a five micron overlap, the improvement in capacitance is still more than an order of magnitude.

In addition to providing a reliable mechanism for positioning the low resolution features relative to the previously formed high resolution features, the alignment marks generated during the formation of high resolution features may also be utilized to automatically control (position) a print head during a stitching process used to repair unintended gaps (as discussed above), or a scheduled stitching process used to connect separately formed sections of the desired TFT array.

Figure 6A:
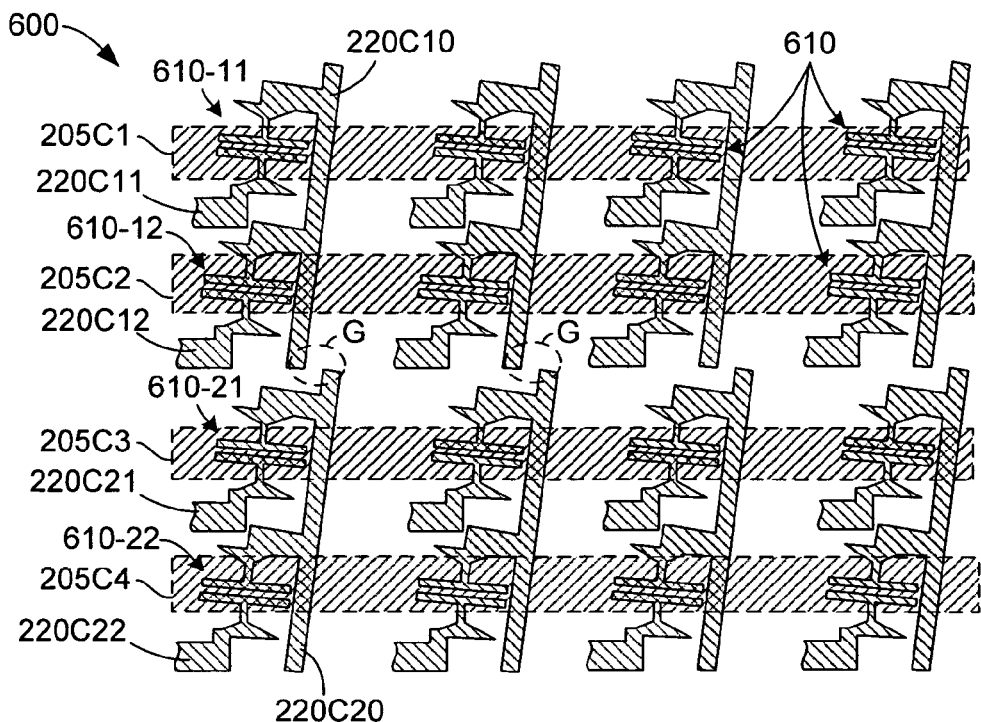
FIGS. 6(A) and 6(B) are plan views illustrating a method for producing integrated circuits using jet-printed stitching according to another embodiment of the present invention.
Figure 6B:
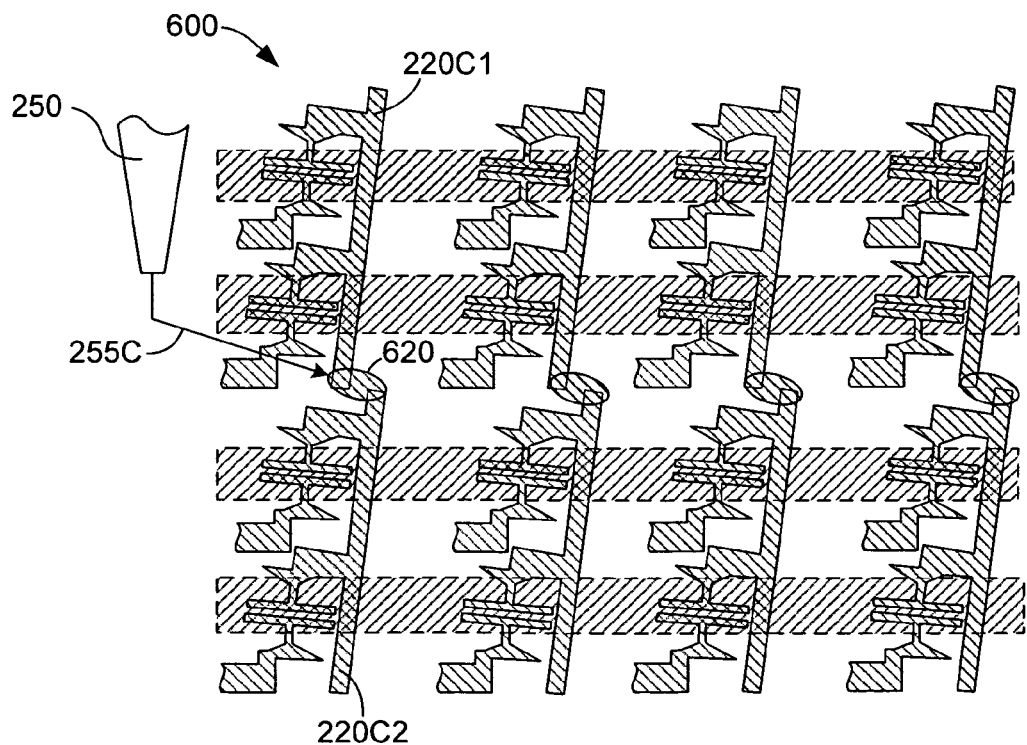

FIGS. 6(A) and 6(B) illustrate use of the stitching process described above to connect ("stitch") separately formed features of a pixel array. FIG. 6(A) shows a pixel array 600 including TFTs 610 that are formed over shared gate structures 205C1 through 205C4. Each TFT 610 includes a high resolution source terminal and a high resolution drain terminal formed by soft lithography over a corresponding gate structure in the manner described above, and low resolution row and column conductors are connected to the source and drain terminals by the jet-printed mask technique described above. For example, the source of TFT 610-11 is connected to column conductor segment 220C10, and the drain of TFT 610-11 is connected to row conductor segment 220C11. Similarly, the source of TFT 610-12 is connected to column conductor segment 220C10, and the drain of TFT 610-12 is connected to row conductor segment 220C12. In the same manner, the sources of TFT 610-21 and TFT 610-22 are connected to column conductor segment 220C20, with the drain of TFT 610-21 connected to row conductor segment 220C21, and the drain of TFT 610-22 connected to row conductor segment 220C22.

For purposes of this example, the jet-printed mask (not shown) utilized to form the low resolution interconnect structures is assumed to be smaller than the substrate on which pixel array 600 is formed, and thus must be repositioned and utilized in several steps to cover the entire array. For example, the stamp and mask operations used to form TFTs 610-11 and 610-12 is performed at a different time than the stamp and mask operations used to form TFTs 610-21 and 610-22 (which are connected to column conductor segment 220C20 and row conductor segments 200C21 and 220C22, respectively). Accordingly misalignment between the sequentially performed low resolution processes may result in gaps G between column conductor segments 220C10 and 220C20. In this embodiment, the jet-printed mask has been positioned relative to the associated stamped source/drain structures using alignment marks (not shown) in the manner described above, and a resulting misalignment has created gaps G between adjacent column conductor segments. These gaps are detected by the process control system based on the recorded location of the alignment marks printed with the high resolution source/drain features, and based on the known position of the jet-printed etch mask during formation of the low resolution interconnect structures, the jet-printing system is controlled to form conductive bridge structures 620 by ejecting a conductive print solution 255C into gaps G, thus connecting associated column conductor segments (e.g., column segments 220C1 and 220C2).

In yet another embodiment, gaps between adjacent sections of the TFT array may be purposefully generated, with the stitching process included as part of the manufacturing process to close the gaps after the low resolution etching step. For example, sections of pixels may be formed using a stamp that contains n×n pixels. This stamp is rastered over the substrate to form a p×m array of stamped pixels. The stamped pixels are then processed to form interconnect lines, and or each stamped pixel array is then interconnected using a printed "stitch" interconnect. This approach will reduce the amount of "stitch" points for interconnecting pixels and also allow smaller pixel dimensions within the array.

Figure 7:
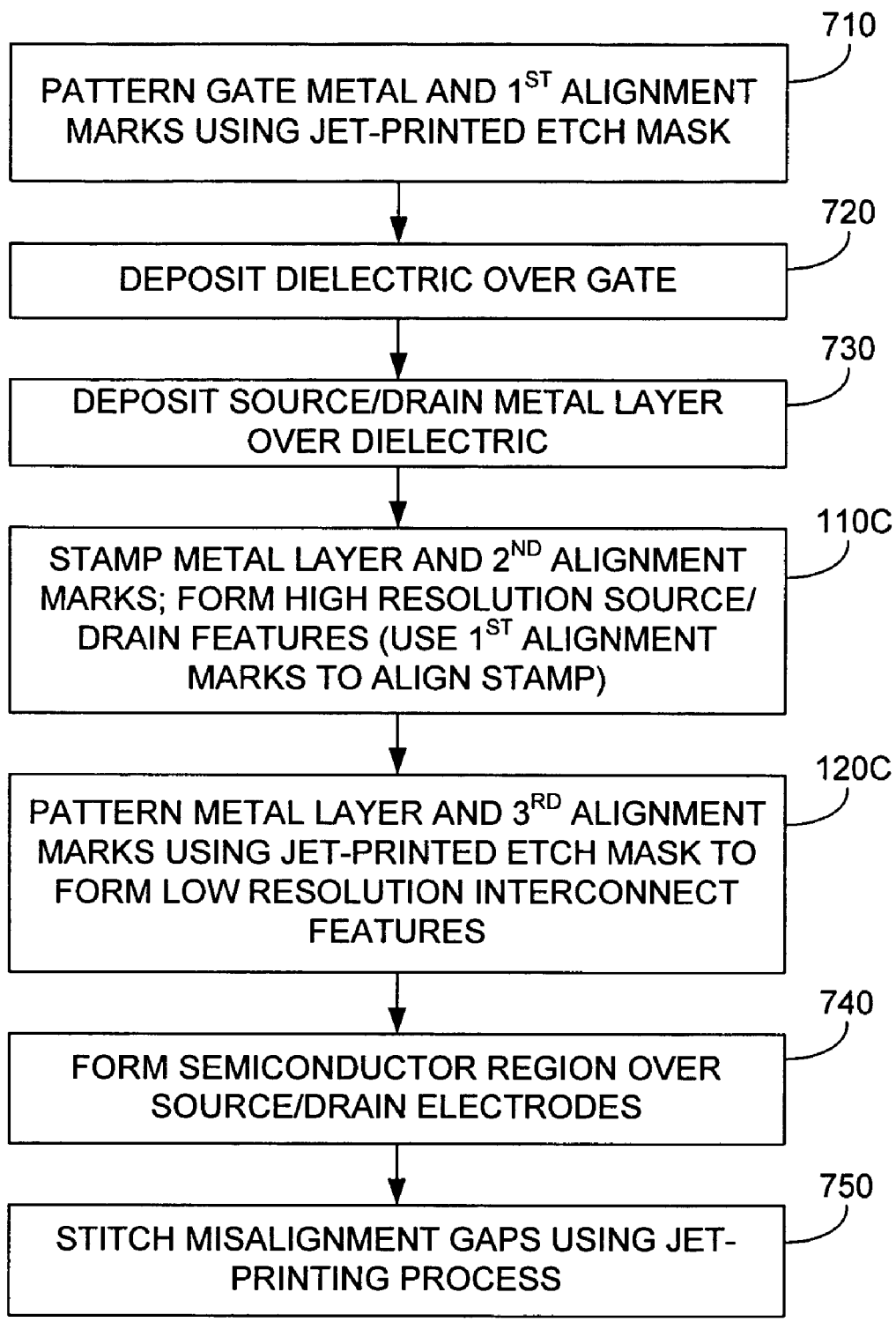
FIG. 7 is a flow diagram showing a simplified method for producing bottom-gate TFTs according to another embodiment of the present invention.

FIG. 7 is a flow diagram showing a method for fabricating a bottom gate TFT array, which would be suitable for producing a polymer semiconductor or perhaps amorphous silicon TFT. As indicated above, the present invention may be used to provide a highly flexible (tolerant) method for generating TFT arrays for large area electronic devices.

Referring to the upper portion of FIG. 7, the production method begins by forming a gate structure and optional first alignment marks on a substrate using a low resolution, jet-printed etch mask (block 710), forming a dielectric layer over the gate structure (block 720), and then depositing a source/drain metal layer over the dielectric layer (block 730). In one specific embodiment, the gate structure and associated alignment marks are formed from a gate (first) metal layer that is patterned using the jet-printed etch mask in a manner similar to that described above with reference to the formation of low resolution interconnect structures. Note that the first alignment marks are patterned along with the gate structure, and are electrically isolated from the gate structure after the gate metal etching process. The locations of the first alignment marks are detected and stored for future use (e.g., to position the stamp for forming the source/drain electrodes). After the gate metal etching process is completed, the dielectric is deposited over the gate structure and alignment marks, and then the source/drain metal layer is formed over the dielectric layer.

High resolution source/drain electrodes and low resolution interconnect structures are then formed in the manner described above. First, the source/drain metal layer is stamped and processed to form the high resolution source/drain electrodes (block 110C). Note that the first alignment marks are utilized to position the stamp such that the source/drain electrodes are formed over associated gate structures. Next, retained portions of the source/drain metal layer are patterned using a jet-printed etch mask in the manner described above to form associated interconnect structures (block 120C). The low resolution process may use one or both sets of alignment marks from the gate metal and the stamped source-drain metal to correct for any misalignment of the stamping process. The positions of the two sets of alignment marks is measured, for example by a camera, and the exact position of the two layers can be calculated from which the misalignment is reduced (a software routine may be used to perform this function automatically). The printed etch mask will cover the fine features of the stamp, and provide a low resolution pattern connecting the TFT to the rest of the circuit. Semiconductor structures are then formed over each source/drain electrode pair to facilitate transistor operation (block 740), and then misalignment gaps are stitched according to the method described above (block 750).

FIGS. 8(A) to 8(F) are simplified top views showing portion of a TFT array formed in accordance with a specific embodiment of the method shown in FIG. 7.

Figure 8A:
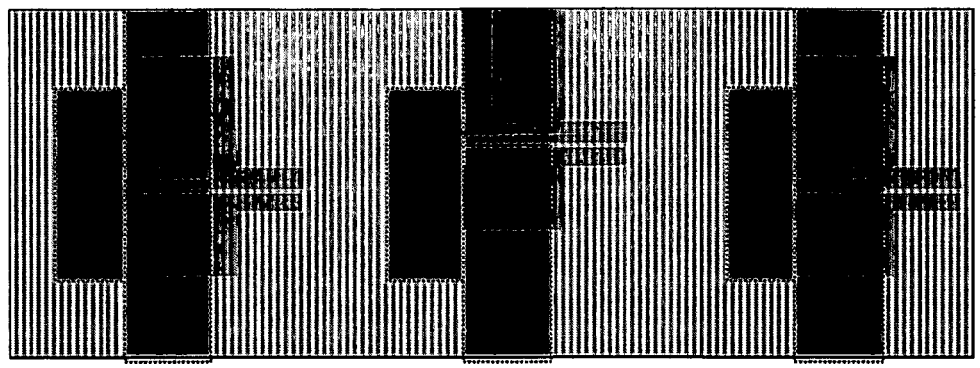
FIGS. 8(A), 8(B), 8(C) and 8(D) are plan views illustrating exemplary selected stages of the method of FIG. 7.

FIG. 8(A) shows the device structure after the gate metal has been patterned (light shaded color), the dielectric deposited, and the high resolution pattern has been printed in the source-drain (S/D) metal. The dark region indicated the location where the source/drain metal has been removed. The high resolution source/drain electrode structures occur in different places in each pixel to indicate the random error in stamping.

Figure 8B:
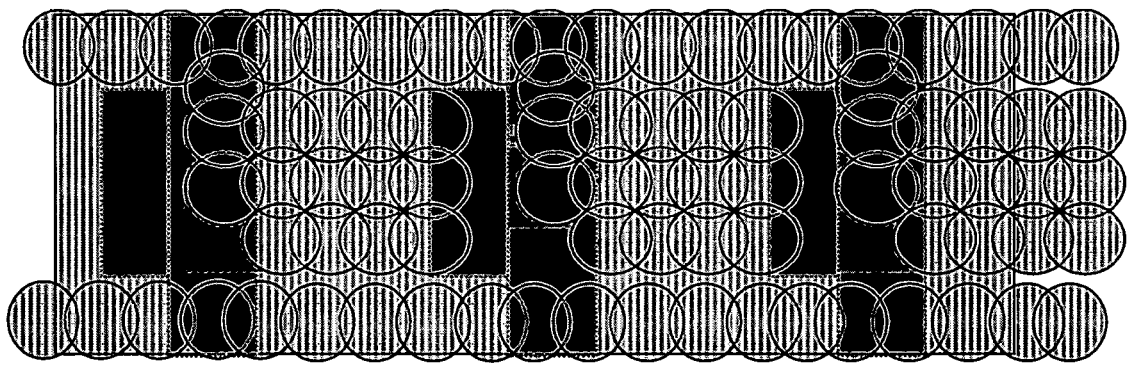

Referring to FIG. 8(B), the circles represent the individual drops ejected by the jet-printer to create the etch mask that is used during the low resolution etching process to remove the remaining unwanted sections of the source/drain metal layer. This etch mask is designed to accommodate errors in the stamp pattern position, but is aligned to the bottom metal so that the pixel dimension is precise even if the stamped TFT has significant error in position.

Figure 8C:
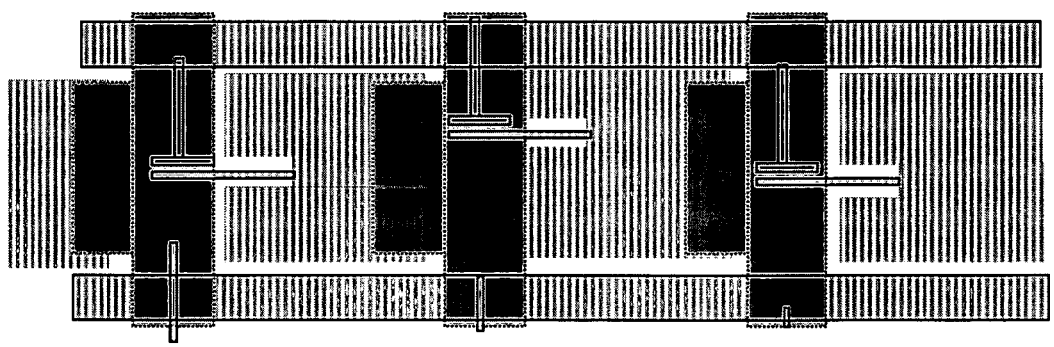

FIG. 8(C) shows the final pattern of the source/drain metal layer after both the high resolution and low resolution processing phases.

Figure 8D:
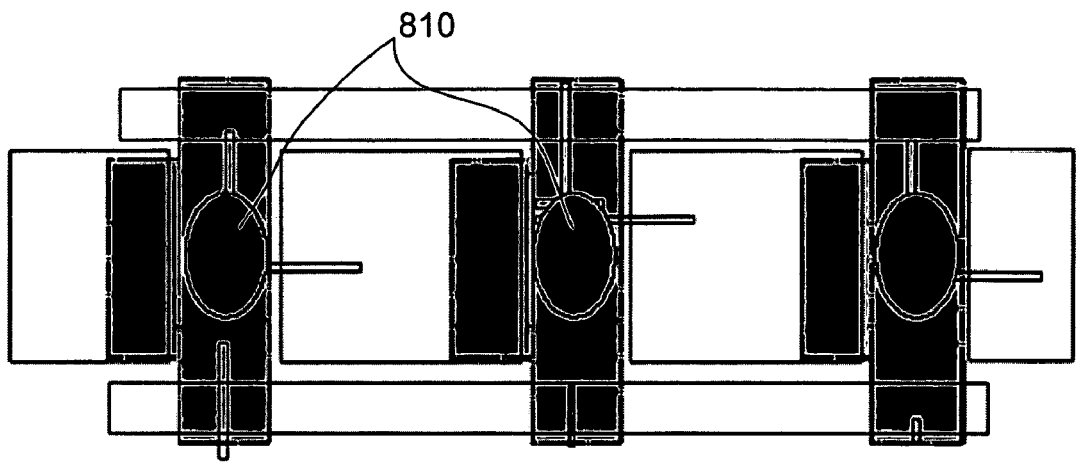

FIG. 8(D) shows the TFT after a polymer semiconductor 810 (oval region) has been printed over the source and drain electrodes. The polymer printed region is large enough to cover the TFT electrodes, taking into account their positioning error, thus providing a highly tolerant TFT production method.

Figure 9A:
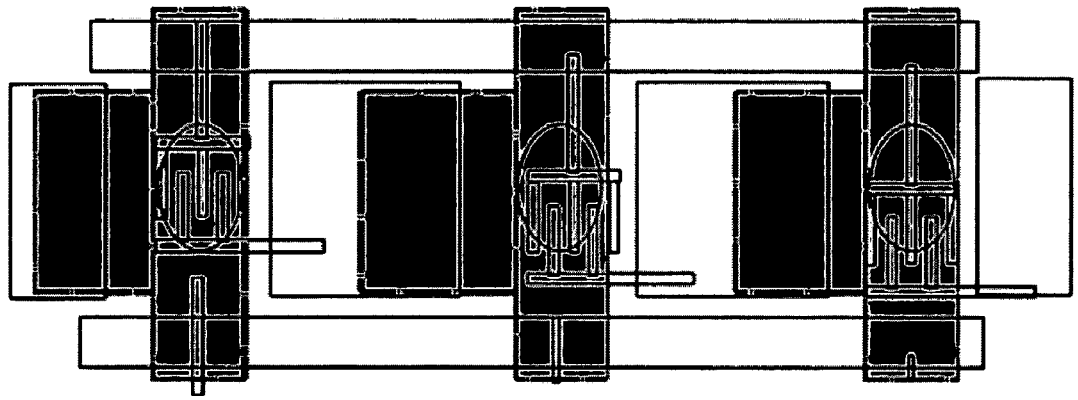
FIGS. 9(A) and 9(B) are plan views showing alternative TFT structures produced using the method of FIG. 7.
Figure 9B:
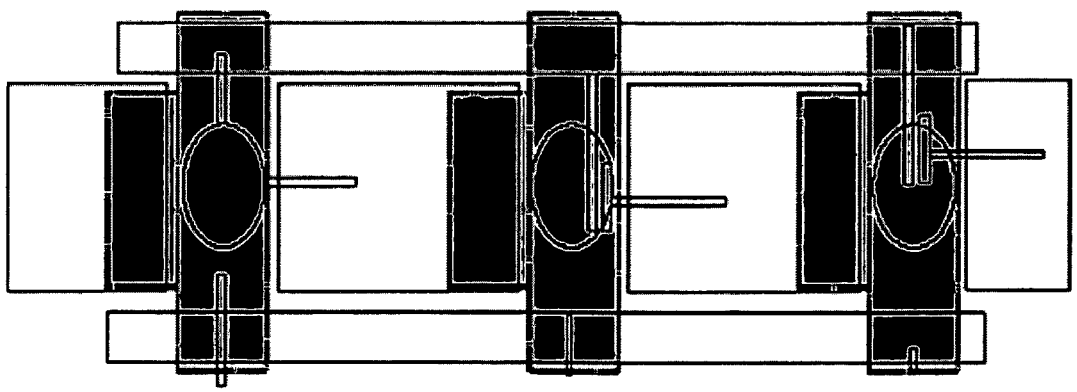

FIGS. 9(A) and 9(B) show alternative designs for the high resolution TFT, which may provide advantages over the embodiment shown in FIG. 8(D), depending on the requirements of the electronic circuit and the expected uncertainty in the positioning of the stamp.

To further improve the tolerance to misalignment of the stamp to the first metal layer, it is possible to stamp redundant features in the high resolution process and use the second masking step to choose the features that are best aligned and remove the others. For example, the mask could contain several copies of the source-drain contact structure at different positions, as illustrated in FIGS. 10(A) and 10(B). Note that FIG. 10(A) depicts a redundant feature pattern that is primarily correcting horizontal and rotational misalignment, and FIG. 10(B) depicts a redundant feature pattern that is primarily for correcting vertical misalignment. After the stamping process the alignment marks for the two layers are inspected and the optimum device location can be selected automatically. The second masking step is then designed (automatically) to keep the chosen device and eliminate the non-optimal redundant patterns. Patterns can be designed to optimize for the known type and magnitude of the misalignment of a particular printing process.

FIG. 11 shows another redundant pattern in which several substantially identical redundant features are printed over a substrate in the vicinity of a gate structure (shaded region). Assuming that the gate structure width patterned by jet-printing has a width G, it can be seen that the linewidth and resolution of the high-resolution stamp is much smaller than G. The channel length of the TFT patterned with the high-resolution stamp is L. Assuming that one can easily achieve small angular deviations between the high-resolution stamp and the gate lines (e.g. use of a roller with sprockets), a spacing of G-L between TFTs will allow to have always at least one TFT over the gate line.

Figure 12A:
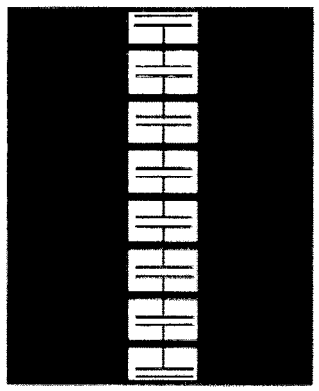
FIGS. 12(A), 12(B) and 12(C) are plan views showing a production process implementing redundant source/drain structures according to yet another embodiment of the present invention.
Figure 12B:
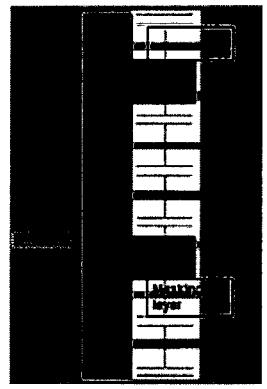
Figure 12C:
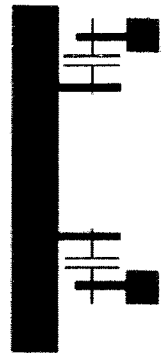
Figure 13:
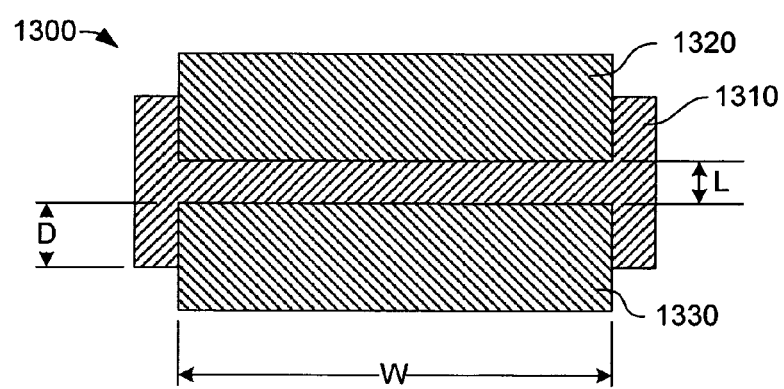
FIG. 13 is a top plan view showing a conventional TFT structure.

FIGS. 12(A), 12(B) and 12(C) depict another high-resolution stamp pattern that is designed to produce redundant devices in a column. FIG. 12(A) shows an array of such redundant devices, which may extend over a gate line (not shown) in the manner described above). As shown in FIG. 12(B), in a following low resolution masking step (indicated by dark region), one or more suitable or optimal redundant structures is/are selected order to minimize the overlap capacitance at the pixel pad. As indicated in FIG. 12(C), after masking the selected features, the TFT array is completed by etching the unmasked (non-selected) features and other exposed portions of the source/drain metal layer.

The redundancy of the high resolution stamp also allows fabrication of a generic masking layer for the via holes for the pixel pads. The via connects to a metal contact layer above the plane of the TFT. The idea is to allow for a via hole on either side of the gate line. Regardless of which transistor contact is chosen to be the pixel contact, one of the two via holes will contact the transistor. This via layer is simply aligned to the masking layer used to choose the transistor, and is independent of which transistor and contact were chosen from the high-resolution pattern.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for producing a patterned thin film layer on a device substrate, the method comprising:
   forming a relatively high resolution first structure on the device substrate using a first processing tool; and
   forming a relatively low resolution second structure on the device substrate using a second processing tool such that the first structure is connected to the second structure,
   wherein using the second processing tool comprises:
   jet-printing a printing liquid onto the substrate to form a mask; and
   using the mask to form the second structure on the device substrate, and
   wherein using the first processing tool comprises stamping an etch resist pattern over a material layer formed on the device substrate, and then etching first portions of the material layer defined by the etch resist pattern such that retained second portions of the material layer include the first structure, and
   wherein forming the second structure comprises:
      printing a patterned resist layer over the first structure and the retained second material layer portions; and
      etching third portions of the retained second material layer portions defined by the patterned resist layer such that selected sections of the retained second material layer portions form the second structure.

2. The method according to claim 1, further comprising jet-printing a print solution onto the device substrate such that a conductive bridge structure formed by the print solution contacts at least one of the first structure and the second structure.

3. A method for producing a patterned thin film layer on a device substrate, the method comprising:
   forming a relatively high resolution first structure on the device substrate using a first processing tool such that the first structure is connected to a retained material layer portion, wherein the first structure and the retained material layer portion comprise a material layer; and
   processing the retained material layer portion to form a relatively low resolution second structure on the device substrate using a second processing tool such that the first structure is connected to the second structure, wherein processing the retained material layer portion comprises:
      jet-printing a patterned resist layer over the first structure and a first portion of the retained material layer portion such that a second portion of the retained material layer portion is exposed through an opening defined in the patterned resist mask;
      etching the second portion of the retained material layer portions exposed through the patterned resist layer such that the first portion of the retained material layer portion forms the second structure.

* * * * *